(12) United States Patent
Heiden et al.

(10) Patent No.: US 7,680,616 B2
(45) Date of Patent: Mar. 16, 2010

(54) METHOD FOR CORRECTING AN ERROR OF THE IMAGING SYSTEM OF A COORDINATE MEASURING MACHINE

(75) Inventors: Michael Heiden, Woelfersheim (DE); Klaus Rinn, Heuchelheim (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 0 days.

(21) Appl. No.: 12/218,387

(22) Filed: Jul. 15, 2008

(65) Prior Publication Data

US 2009/0024344 A1    Jan. 22, 2009

(30) Foreign Application Priority Data

Jul. 16, 2007    (DE)    ................ 10 2007 033 345

(51) Int. Cl.
*G01C 17/38*    (2006.01)
(52) U.S. Cl. ........................................ 702/95
(58) Field of Classification Search .............. 702/95
See application file for complete search history.

(56) References Cited

U.S. PATENT DOCUMENTS

| | | | | |
|---|---|---|---|---|
| 6,317,991 | B1 | 11/2001 | Rinn | 33/1 M |
| 6,323,953 | B1 | 11/2001 | Blaesing-Bangert et al. | 356/614 |
| 6,920,249 | B2 | 7/2005 | Rinn | 382/199 |
| 2002/0057839 | A1* | 5/2002 | Rinn et al. | 382/199 |
| 2004/0268289 | A1* | 12/2004 | Sandstrom et al. | 716/19 |
| 2005/0157296 | A1 | 7/2005 | Hayano | 356/401 |
| 2005/0231722 | A1 | 10/2005 | Ausschnitt et al. | 356/401 |
| 2006/0286811 | A1* | 12/2006 | Heiden et al. | 438/759 |
| 2007/0002323 | A1 | 1/2007 | Fukui et al. | 356/401 |

FOREIGN PATENT DOCUMENTS

| | | |
|---|---|---|
| DE | 19734695 | 11/1998 |
| DE | 19819492 | 11/1999 |
| DE | 10047211 | 5/2002 |

OTHER PUBLICATIONS

Dieter Adam et al.:"First Measurement Data Obtained On The New Vistec LMS IPRO4," Proc. Of SPIE vol. 6533, $23^{rd}$ European Mask and Lithography Conference, Jan. 2007, 65330I, 1-7 (7 pages).

A. Starikov et al. "Accuracy of the overlay measurement: tool and mask asymmetry effects," (3.1 Tool-Induced Shift TIS); Optical Engineering, vol. 31, No. 6, pp. 1298-1310, 1992.

Carola Blaesing:"Pattern Placement Metrology for Mask Making," presented by Dr. Carola Bläsing at the Semicon meeting, Education Program in Geneva, Switzerland on Mar. 31, 1998, 11 pages.

* cited by examiner

*Primary Examiner*—Aditya Bhat
(74) *Attorney, Agent, or Firm*—Davidson, Davidson & Kappel, LLC

(57) ABSTRACT

A method for correcting an error of the imaging system of a coordinate measuring machine is disclosed. The position of at least two different edges of at least one structure on a substrate is measured. The substrate may be automatically rotated into another orientation. Then the position of the at least two different edges of the at least one structure is measured on the rotated substrate. Based on the measurement data, a systematic error of the imaging system is eliminated.

9 Claims, 7 Drawing Sheets

METHOD FOR CORRECTING AN ERROR OF THE IMAGING SYSTEM OF A COORDINATE MEASURING MACHINE

This claims the benefit of German Application No. DE 10 2007 033 345.7, filed on Jul. 16, 2007 and hereby incorporated by reference herein.

The present invention relates to a method for correcting an error of the imaging system of a coordinate measuring machine.

BACKGROUND

A measuring device for measuring structures on masks or substrates used for the production of semiconductors is disclosed in the lecture script "Pattern Placement Metrology for Mask Making" by Dr. Carola Bläsing. The lecture was given on the occasion of the Semicon conference, Education Program, in Geneva on Mar. 31, 1998. The basic principles of a coordinate measuring device are described in detail in this lecture script. For details regarding operation and structure of the coordinate measuring device, see FIG. 1 of the present patent application.

A measuring device for measuring structures on a transparent substrate may also be found in the published application DE 19819492. The measuring device includes an incident light illumination means, an imaging means and a detector means to image the structures on the substrate. The substrate is deposited on a displaceable measurement table, which may be displaced perpendicularly with respect to the optical axis. The position of the measurement table is determined interferometrically. Edge profiles of the structures are registered by the detector means. Based on the profiles, the positions of the edges of the respective structure may then be determined.

The patent specification DE 10047211 discloses a method and a device for determining the position of an edge of a structure element on a substrate. In the suggested method, first an image of the edge to be measured is taken. A one-dimensional intensity profile is generated from the pixels of the camera image. Then the edge position $X_K$ is determined with sub-pixel accuracy in the at least one intensity profile. Although this method finds the edges with very good repeatability, it is evidently not capable of correcting systematic errors caused, for example, by the imaging optics. A special category of these non-detected errors appears as position difference obtained between the measurement of an edge in 0° orientation of the structure and in 180° orientation of the structure at the same location.

SUMMARY OF THE INVENTION

It is an object of the present invention to provide a method with which this systematic error caused by the imaging optics may be corrected.

The present invention provides a method for correcting an error of an imaging system of a coordinate measuring machine including the steps of:
measuring a position of at least one edge of at least one structure on a substrate, wherein the substrate is positioned in a first orientation in the coordinate measuring machine, and the position of the at least one edge is determined within a measurement window, defined in the coordinate system of a camera;
setting a second orientation of the substrate differing from the first orientation;
measuring the position of the at least one edge of the at least one structure on the substrate in the second orientation, wherein the at least on edge of the structure is after the rotation at the same location within the measurement window as without rotation; and
eliminating a systematic error of the imaging system of a measurement optic, of the coordinate measuring machine.

The rotation of the substrate may be set automatically. The set rotation may be determined by the coordinate measuring machine for verification. The second orientation set by rotation of the substrate may include 120°, 180° or 240°. The systematic error that is eliminated is the error of measurement optics. With the help of the method, the position of at least one edge of the structure is determined within a measurement window defined in the coordinate system of the camera, and wherein, after rotating the substrate, the same location on the edge is located in the measurement window as for the substrate without rotation.

In another embodiment, it is advantageous if the position of two different edges of the structure is determined within a measurement window defined in the coordinate system of the camera, and that, after rotating the substrate, the same locations on the two edges are located in the measurement window as for the substrate without rotation.

For the substrate rotated by 180°, the structure to be measured is arranged in the same way with respect to the measurement objective. The measurement window is shifted in a coordinate system of the detector such that, for the substrate rotated by 180°, the measurement window is located at the same location on the structure to be measured as the location of the substrate rotated by 0°. The measurement data regarding the position of the location of the edge for a substrate rotated by 180° are mathematically rotated back, wherein an error component is rotated therewith such that now the error components in the 0° and 180° orientations are approximately equal but opposite and this systematic error component is corrected by statistical evaluation.

The measurement window of the structure is scanned at the same location as the location for the measurement of the substrate rotated by 0°.

The systematic error is determined by averaging two different measurement values regarding the position of the edge of the structure. The correction values are stored to be used for identical data sets for eliminating the error. A variety of instructions are made available to a user on a display. The user may combine these instructions for execution in any desired way. The instructions combined by the user are executed automatically. This is advantageous in that the magnitude of the error may be determined by measuring the mask in positions of 0° and 180° and may then be corrected. If the coordinate measuring machine is provided with means for orienting the mask or the substrate, this measurement may be conducted completely automatically. The mask or the substrate does no longer have to be rotated manually.

BRIEF DESCRIPTION OF THE DRAWINGS

In the following, embodiments will explain the invention and its advantages in more detail with reference to the accompanying figures.

FIG. 5b shows a schematic arrangement of the measurement window, designed according to a position of an edge of the structure of FIG. 5a, wherein the structure is rotated by 180° as compared to FIG. 5a;

DETAILED DESCRIPTION

Figure 1:
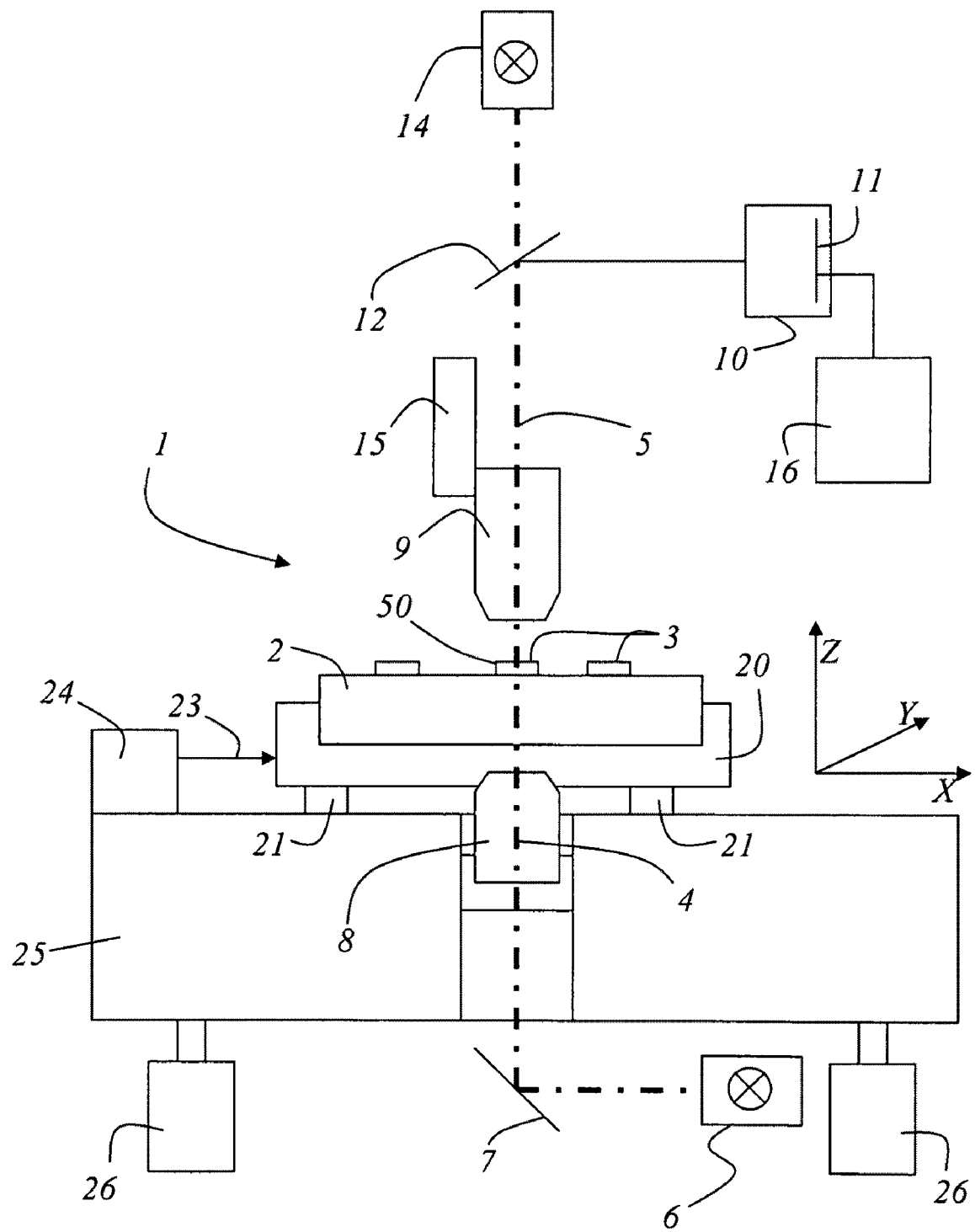
FIG. 1 schematically shows a prior art coordinate measuring device.

A coordinate measuring device 1 of the type shown in FIG. 1 has already been known from prior art for some time. The coordinate measuring device 1 includes a granite block 25 positioned on vibration dampers 26. On the granite block 25, a measurement table 20 implemented as a frame is arranged on air bearings 21 to be displaceable slidably in the X-coordinate direction and in the Y-coordinate direction. The frame of the measurement table 20 advantageously consists of a glass ceramic having a low thermal expansion coefficient. The drive elements for moving the measurement table 20 are not illustrated. The position of the measurement table 20 is measured in the X-coordinate direction and in the Y-coordinate direction by a laser interferometer system 24 emitting a measurement light beam 23. A mask 2 or a substrate is inserted in the frame of the measurement table 20. The mask 2 consists, for example, of fused silica. At least one structure 3 with an edge 50 to be measured is provided on the mask surface. The position of this edge 50 is to be determined. As the measurement table 20 is implemented as a frame, the mask 2 may also be transilluminated from below.

Above the mask 2, a measurement objective 9 having optical errors that are as small as possible, but still not negligible is located as imaging system adjustable in the Z-coordinate direction along an optical axis 5 for focusing. The optical axis 5 defines the reference point for the measurement of the relative position of the edge 50. The measurement objective 9 is adjustable in the Z-coordinate direction via an adjusting means 15. From an incident light source 14, the light reaches the surface of the mask 2 through the measurement objective 9. The light collected by the measurement objective 9, which comes from the mask 2, reaches a camera 10 via a beam splitter mirror 12. The camera 10 is implemented, for example, as a CCD camera and is connected to a computing unit 16 generating digital images from the acquired signals. The incident light source 14 emits, for example, in the near UV spectral range. By means of the camera 10, an image of the edge 50 of the structure 3 is acquired, from which the position of the edge 50 is determined as coordinates on the mask 2. The CCD camera may be provided with a high-resolution pixel array. However, other detector means are also usable as long as an intensity profile for a measurement window within the camera image may be determined from their image signals.

A condenser 8 adjustable in height is inserted in the granite block 25. A further illumination source 6 is associated with the condenser 8. This illumination source 6 acts as transmitted light source and defines a transmitted light optical illumination path 4. The transmitted light optical path 4 is directed to the condenser 8 by means of a deflecting mirror 7. It is also contemplated that the light of the illumination source 6 is launched into an optical waveguide by means of launching optics. The light leaving the optical waveguide is collected from the optical waveguide by means of coupling-out optics and then input into the condenser.

The coordinate measuring machine 1 has associated therewith a computer 16 connected to the camera 10 and the laser interferometer system 24. Furthermore, a monitor is connected to the computer 16. The monitor 16 serves for displaying the image acquired by the camera. A computer program 16 is installed on the computer 16, with which a user may combine individual method steps to obtain a recipe based on which the coordinate measuring machine may perform a certain measuring procedure or calibration.

Figure 2:
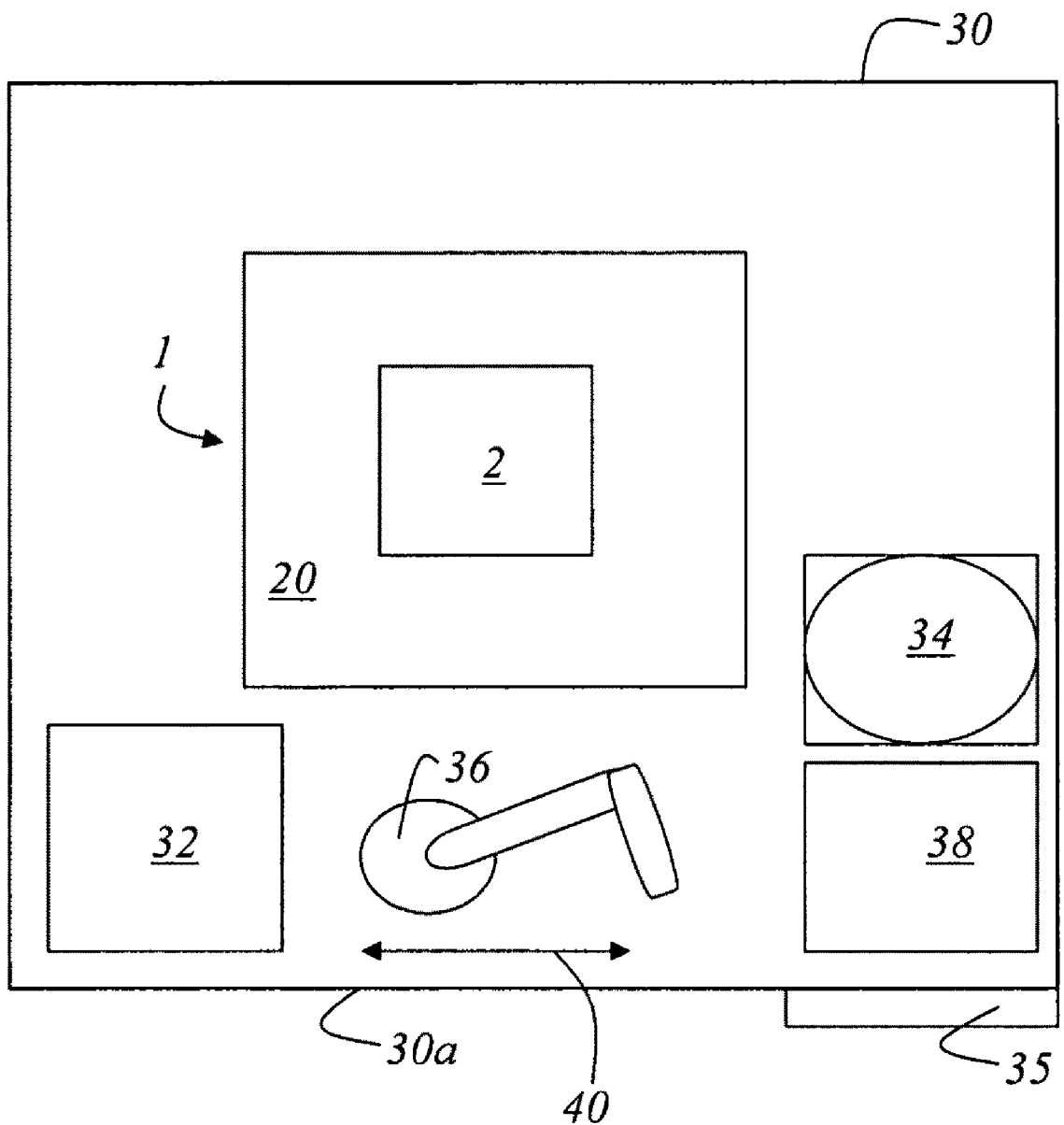
FIG. 2 shows a schematic top view of a coordinate measuring machine having associated therewith, among other means, means for rotating or orienting the substrate.

FIG. 2 shows a schematic arrangement of the coordinate measuring machine 1 in connection with other means for handling the masks 2. The coordinate measuring machine is shown in simplified form in FIG. 2 and represented only by the measurement table 20 and the substrate 2. In the embodiment shown, the coordinate measuring device 1 is arranged in a climatic chamber 30. A magazine 32 where the masks 2 may be stored temporarily for temperature adaptation may, for example, also be provided within the climatic chamber 30. A transfer station 35 with which masks may be transferred into the climatic chamber 30 is provided in an outer wall 30a of the climatic chamber 30. Downstream of the transfer station 35, there is a transfer station 38 in which the masks may be temporarily stored for a short time before they are received by another means. A means 34 for orienting the substrates is also arranged in the climatic chamber 30. For example, the masks 2 are transferred from the transfer station 38 to the means 34 for orienting. Depending on the instructions given by the user, a predetermined orientation of the mask 2 is then set in the means 34 for orienting. The mask 2 is then returned to the transfer station 38 with this orientation. From there, the mask 2 in the desired orientation may be picked up by the robot 36. The robot 36 may be moved in the direction 40 shown in FIG. 2. The robot 36 may deposit the correspondingly oriented mask 2 in the coordinate measuring machine 1 or in another means within the climatic chamber 30. The inventive method may be executed with the arrangement shown in FIG. 2. First, a mask 2 is inserted in the coordinate measuring machine 1. Then at least one edge of a structure on the mask is measured. After measuring, the mask is transported to the means 34 for orienting the mask 2 by means of the robot 36. There the mask is rotated by 180° in a defined way and then returned to the coordinate measuring machine to measure the position of the edge of the substrate rotated by 180° of a structure at the same location as for the substrate rotated by 0°.

Figure 3A:
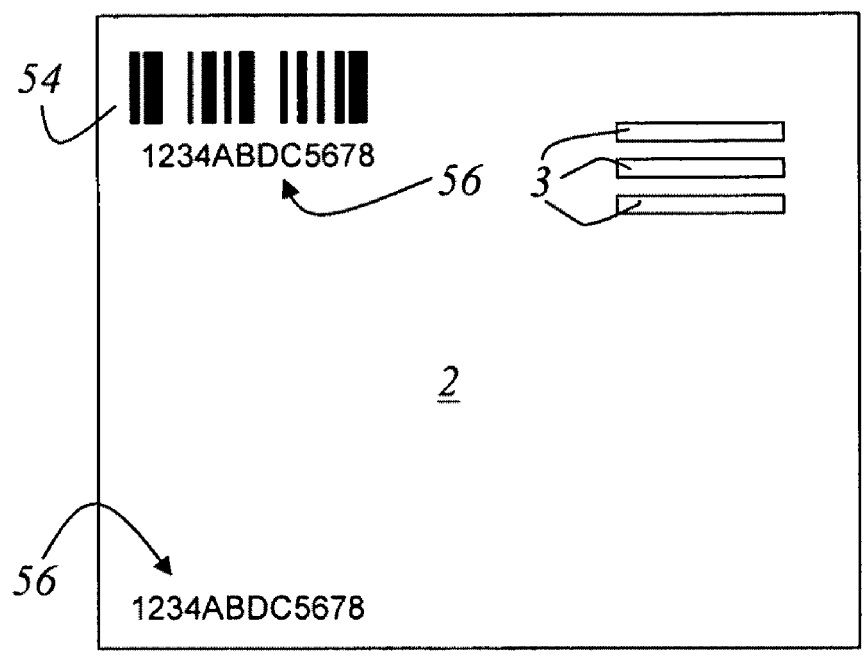
FIG. 3a shows a schematic representation of a substrate in the 0° orientation, wherein the substrate is provided with several marking means and structures.

FIG. 3a shows a schematic representation of a mask 2 with an orientation of 0°. The mask 2 is provided with several markings. One marking 54 may, for example, be a bar code. A further marking 56 is implemented as alphanumeric marking. FIG. 3 also shows schematically drawn structures 3 which, as someone skilled in the art will understand, may assume any shape.

Figure 3B:
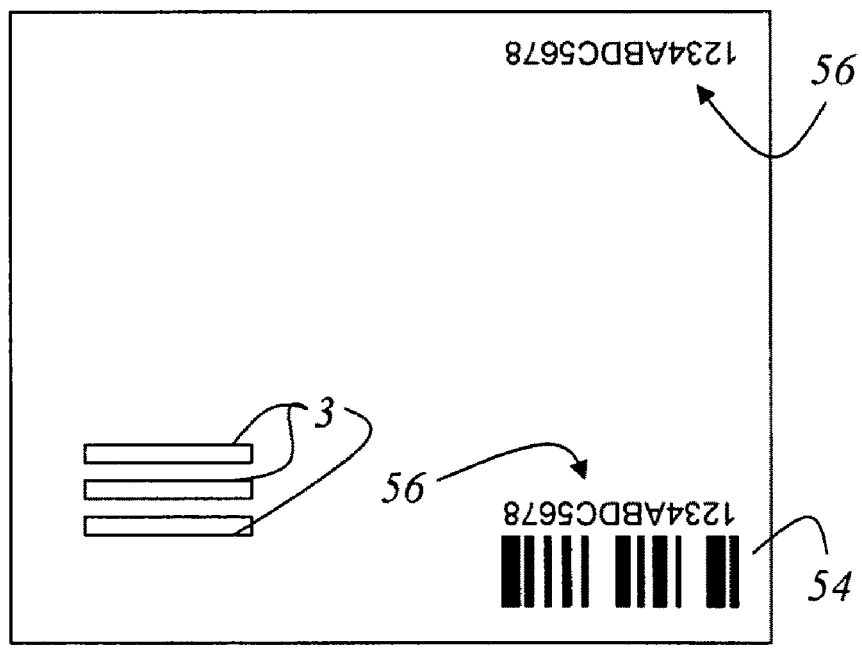
FIG. 3b shows a schematic representation of the substrate in the 180° orientation.

FIG. 3b shows the mask 2 rotated by 180°. The newly set orientation of the mask 2 may be determined with the help of the several markings 54 and 56 applied to the mask 2.

Figure 4:
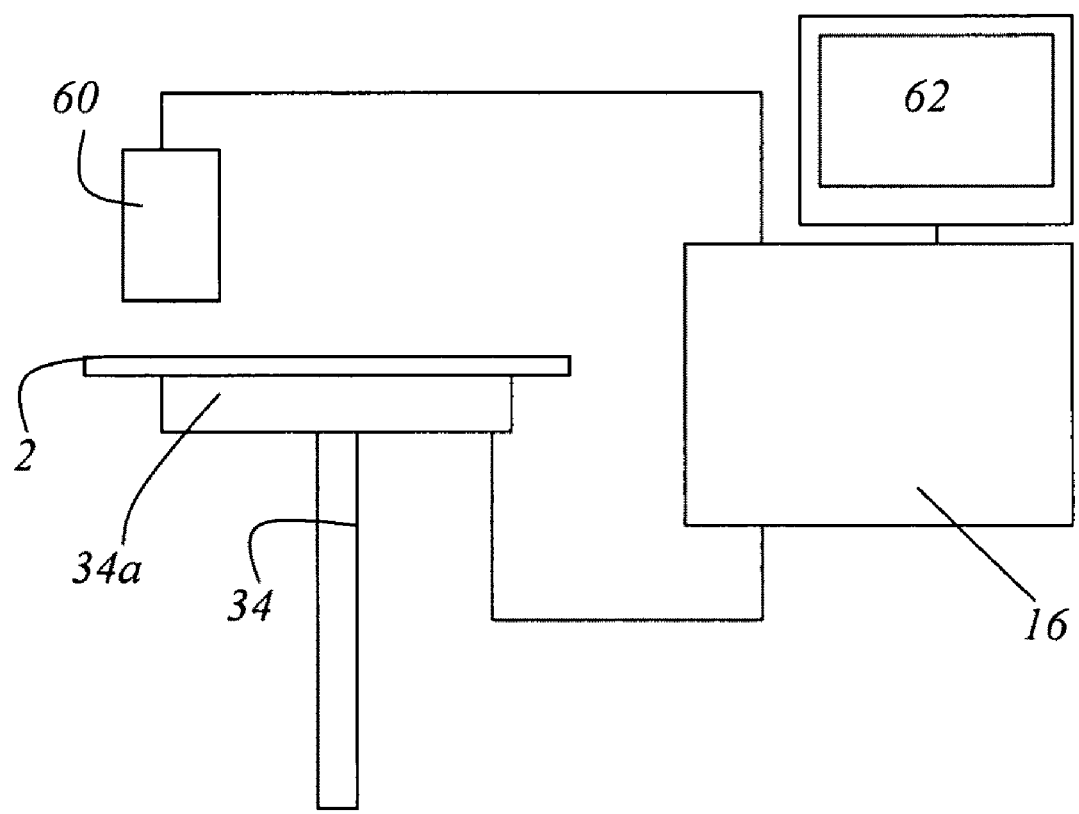
FIG. 4 shows a schematic arrangement of the means for orienting the substrate in connection with a computing unit and with a camera for capturing the surface of the oriented substrate.

FIG. 4 shows a schematic representation of a possible means 34 for orienting the mask 2. The mask 2 is arranged on a rotary plate 34a with which the desired orientations may be set. In the suggested invention, the orientations of 0° and 180° of the mask are set. For verifying whether the desired orientation has been set by the means 34 for orienting, a camera 60 is provided opposite the mask 2. A partial image of the mask 2 or the whole surface of the mask 2 may, for example, be captured by the camera 60. The camera 60 is connected to a computer 16 determining the set orientation of the mask 2 by means of image processing. The computer 16 is also connected to the means 34 for orienting the mask 2. The computer 16 thus controls the means 34 for orienting and thus sets the desired orientation of the mask. There may further be connected a display 62 to the computer, via which the user is informed, for example, of the state of the coordinate measuring machine 1 and the determined data. The user may also input data via the display 62 and compose certain recipes with which a mask is to be inspected.

Figure 5A:
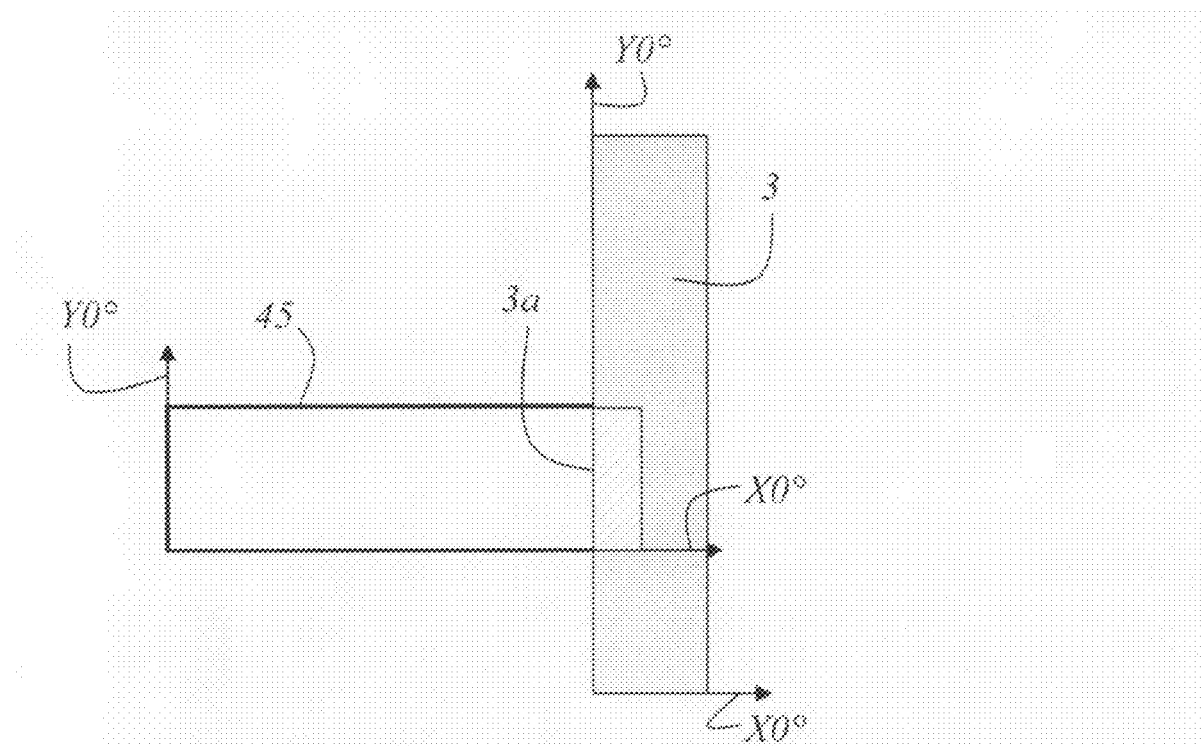
FIG. 5a shows an arrangement of a measurement window with respect to a structure in nominal orientation (no rotation)

FIG. 5a shows the association of a measurement window 45 with a structure 3, wherein an edge 3a of the structure 3 is to be measured with the help of the measurement window 45. The measurement window 45 is defined on the CCD chip of the camera. The measurement window 45 is arranged in the 0° orientation, and the structure 3 is also arranged in the 0° orientation. The 0° orientation is indicated by the reference numerals X-0° and Y-0°, respectively, in both cases.

Figure 5B:
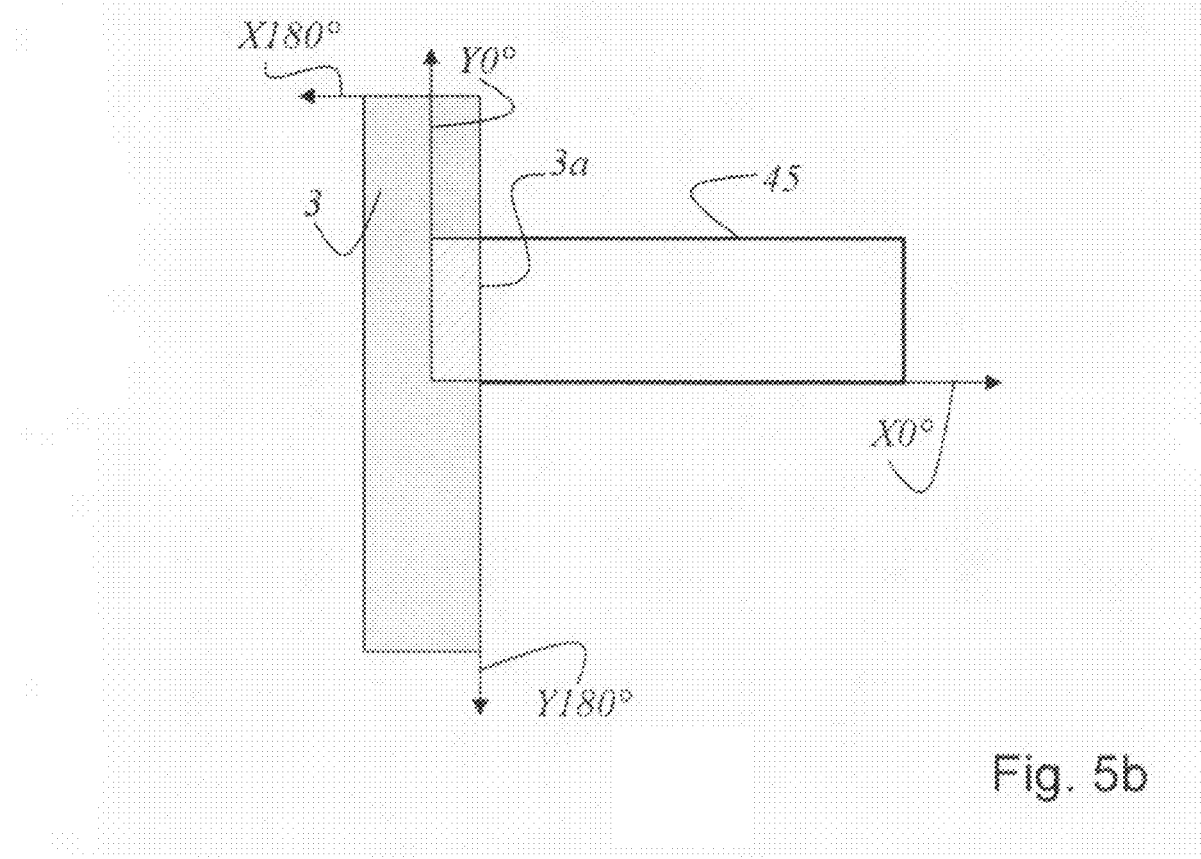

FIG. 5b shows the association of the measurement window 45 with the structure 3 to be measured. The structure 3 to be measured is rotated by 180°. As mentioned above, the rotation of the structure 3 is achieved by rotating the mask 2 by 180°. The rotation of the mask by 180° is effected by the means 34 for orienting the substrate. The edge 3a of the structure 3 is also measured with the help of the measurement window 45. Care must be taken that the measurement window 45 is located at the same location as for the measurement of the edge 3a with the 0° orientation.

Figure 6A:
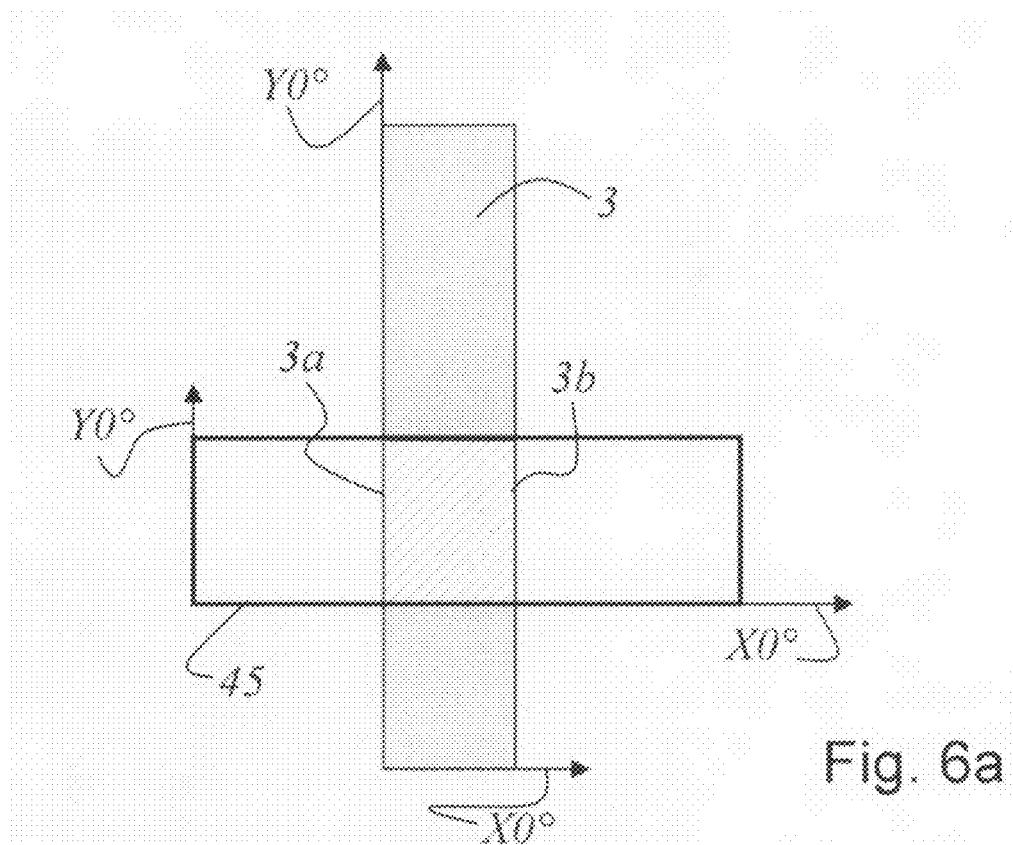
FIG. 6a shows a schematic arrangement of a measurement window with respect to a structure where the position of two different edges is to be measured.

FIG. 6a shows a further association of the measurement window 45 with a structure 3. In the association of the measurement window 45 shown, two opposing edges 3a and 3b of the structure 3 are measured. The measurement of the edges 3a and 3b is performed with a 0° orientation of the mask 2.

Figure 6B:
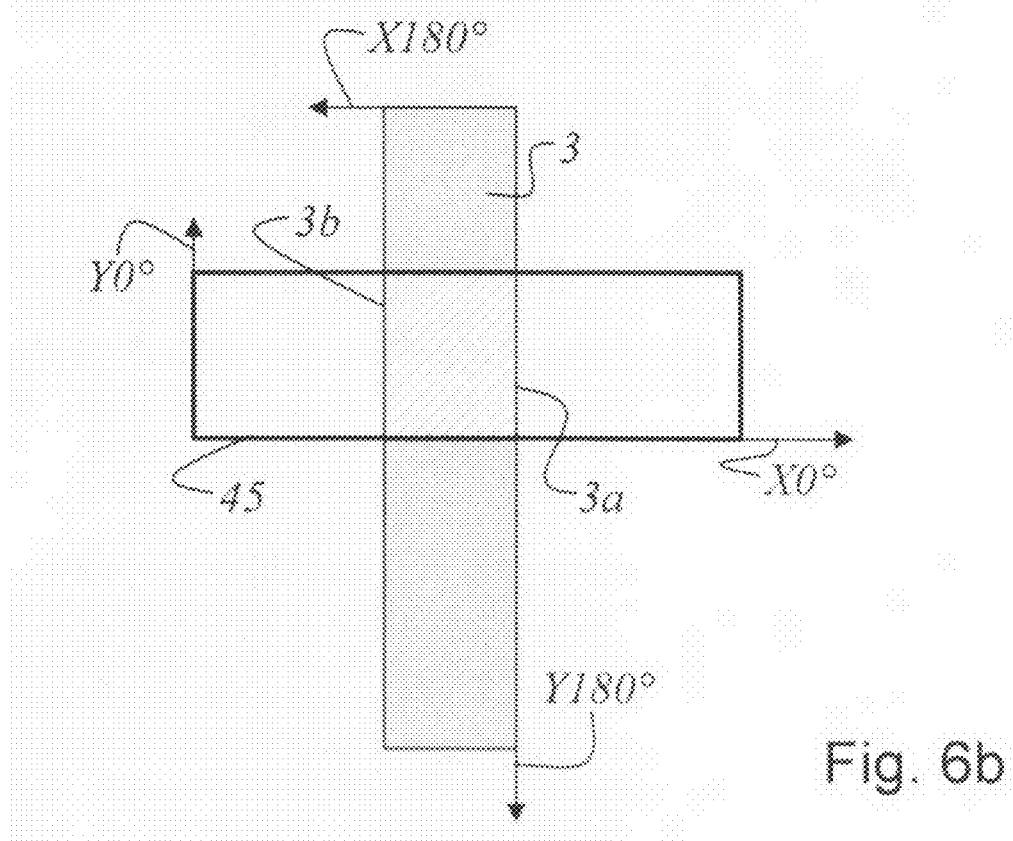
FIG. 6b shows an arrangement of the measurement window with respect to the structure shown in FIG. 6a, wherein the structure or the substrate is rotated by 180°.

FIG. 6b shows the association of the measurement window 45 with the structure 3. The mask 2 is rotated by 180°, and consequently all structures on the mask are also rotated by 180°. The measurement window 45 is associated with the structure 3 such that the edges 3b and 3a are measured at the same location as for the 0° orientation.

Figure 7:
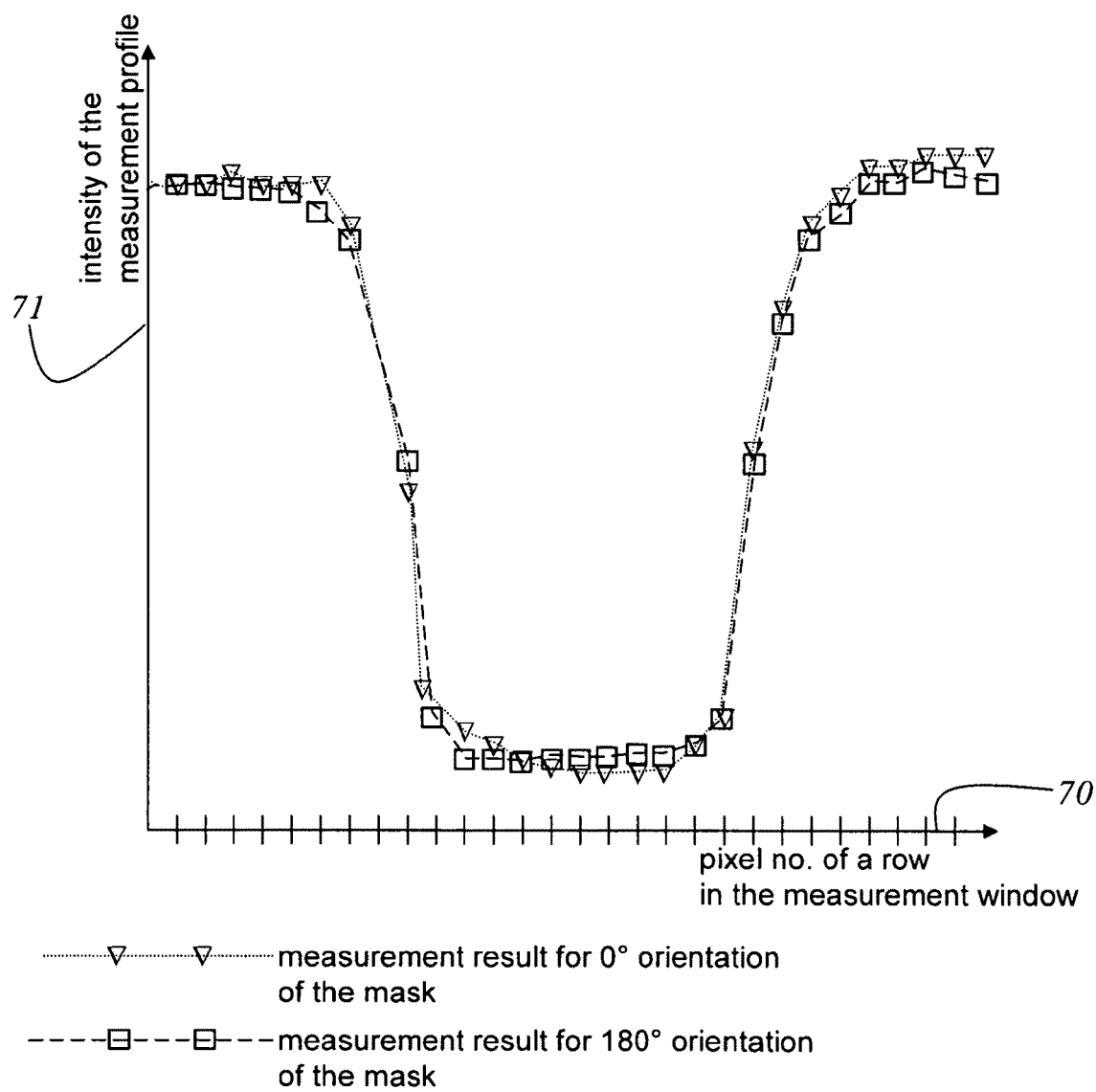
FIG. 7 shows a schematic representation of the determination of an intensity profile of two different edges of a structure, wherein, in one case, the structure is not rotated and, in the other case, it is rotated by 180°.

FIG. 7 shows the representation of two acquired intensity profiles of a structure where the two opposing edges are determined with a measurement window (see FIGS. 6a and 6b). The pixel number of a row in the measurement window 45 is plotted on the abscissa 70. The intensity of the measured measurement profile is plotted on the ordinate 71. The measurement result for the 0° orientation of the mask is represented by triangles connected by a dotted line. The measurement result for the 180° orientation of the mask mathematically rotated back to the 0° orientation is represented by squares connected by a broken line. The intensities were acquired in transmitted light by the coordinate measuring machine 1. In the embodiment shown, the structure 3 is a structure made of chromium, so that the light impinging on this structure cannot pass the mask 2 in the case of transmitted light, so that an intensity drop may consequently by detected at that location of the structure. As soon as the position of the edge is reached in the measurement window, a sharp intensity drop or, at the opposite edge, a sharp intensity increase is detected. The position of the edge is then determined from the drop and/or from the increase. As can be clearly seen in FIG. 7, the behaviors of the intensity profiles for the 0° orientation and the 180° orientation are not identical. Thus it is clear that different results are reached when evaluating the intensity profiles with respect to the position of the edges depending on the orientation. The different measurement results are due to imaging errors of the measurement optics. This systematic measurement error depends on the current structure widths and cannot be exactly predicted in practice. The magnitude of the error, however, may be determined by measuring of the mask in the 0° orientation and the 180° orientation. The optical error sources provide a position error which geometrically always has the same direction with respect to the machine, and which has largely the same magnitude for equal structures. For comparing the 180° results to the measurements in nominal orientation, the position measurement data are mathematically rotated back. The error component is also rotated therewith so that now the error components in the 0° and 180° orientations are approximately equal but opposite. Thus this systematic error component may be corrected by statistical evaluation. The easiest way appears to be the mean value of the 0° measurement and the back-rotated 180° measurement, where the equal but opposite components cancel each other. As mentioned above, it is particularly advantageous if the coordinate measuring machine is also equipped with means 34 for orienting the mask, as in this case the measurement may be conducted completely automatically. The mask 2 does no longer have to be rotated manually, so that a significantly higher throughput for the determination of the systematic measurement error may be achieved. This is, of course, particularly advantageous if the means 34 for setting the orientation of the mask is also provided within the climatic chamber 30 for the coordinate measuring means 1.

What is claimed is:

1. A method for correcting an error of an imaging system of a coordinate measuring machine, the imaging system including measurement optics and a camera that includes a CCD-chip, the method comprising the steps of:

measuring a position of at least one edge of at least one structure on a substrate with the imaging system, wherein the substrate is positioned in a first orientation in the coordinate measuring machine, and the position of the at least one edge is determined within a measurement window defined on the CCD-chip of the camera;

rotating the substrate to set a second orientation of the substrate differing from the first orientation by 180° so that the at least one structure to be measured is arranged in the same way with respect to an optical axis of the measurement optics;

shifting the measurement window defined on the CCD-chip of the camera such that, for the second orientation, the measurement window is located at the same location on the structure to be measured as in the first orientation;

measuring a further position of the at least one edge of the at least one structure on the substrate in the second orientation with the imaging system, wherein the at least one edge of the structure is after the rotating step at the same location within the measurement window as prior to the rotating step; and eliminating a systematic error of the imaging system of the measurement optics of the coordinate measuring machine based on a difference between the measurement at the first orientation and the measurement at the second orientation.

2. The method of claim 1 wherein the rotating step is performed automatically.

3. The method of claim 1 wherein the amount of rotation during the rotating step is determined by the coordinate measuring machine.

4. The method of claim 1 wherein the position of two different edges of the structure is determined within the measurement window, and that, after rotating the substrate, the same locations of the two edges are located in the measurement window as for the substrate without rotation.

5. The method of claim 1 wherein the measurement data regarding the position of the location of the edge for a substrate rotated by 180° are mathematically rotated back, wherein an error component is rotated therewith so that the error components in the 0° and 180° orientations are approximately equal but opposite and the systematic error component is corrected by statistical evaluation.

6. The method of claim 1 wherein the systematic error is determined by averaging two different measurement values regarding the position of the edge of the structure.

7. The method of claim 1 wherein correction values are stored to be used for identical data sets for eliminating the error.

8. The method of claim 1 wherein a variety of instructions are made available to a user on a display, the user combining in the instructions in any desired way for execution to thus obtain a measurement recipe for measuring the substrates.

9. The method of claim 8 wherein the instructions combined by the user are executed automatically.

* * * * *